United States Patent [19]

Jaeger et al.

[11] 4,177,356
[45] Dec. 4, 1979

[54] SIGNAL ENHANCEMENT SYSTEM

[75] Inventors: C. Rene Jaeger, South Lyndeboro, N.H.; Lawrence E. Blakely, Framingham, Mass.

[73] Assignee: DBX Inc., Newton, Mass.

[21] Appl. No.: 843,949

[22] Filed: Oct. 20, 1977

[51] Int. Cl.² .................. H03G 3/00; H04R 25/00
[52] U.S. Cl. .................. 179/1 VL; 179/1 P; 179/1 D
[58] Field of Search .............. 179/1 VL, 1 G, 1 D, 179/1 P, 15.55 R, 15.55 T; 333/14

[56] References Cited

U.S. PATENT DOCUMENTS

| | | | |
|---|---|---|---|
| 2,760,011 | 8/1956 | Berry | 179/1 D |
| 3,247,464 | 4/1966 | Morrison | 179/1 VL |
| 3,789,143 | 1/1974 | Blackmer | 179/15.55 R |
| 3,944,753 | 3/1976 | Proctor et al. | 179/1 P |
| 3,992,584 | 11/1976 | Dugan | 179/1 VL |
| 4,025,723 | 5/1977 | Blackledge | 179/1 VL |
| 4,045,748 | 8/1977 | Filliman | 179/1 VL |

Primary Examiner—Kathleen H. Claffy
Assistant Examiner—E. S. Kemeny
Attorney, Agent, or Firm—Schiller & Pandiscio

[57] ABSTRACT

An improved expanding system is described for enhancing transmitted or recorded audio signals previously processed by anyone of several nonlinear amplifying techniques. The system is designed to divide the audio signal received into substantially discrete frequency bands and each band is separately expanded, independently of the other bands, so as to minimize "breathing" and "pumping".

12 Claims, 4 Drawing Figures

SIGNAL ENHANCEMENT SYSTEM

This application relates to signal conditioning systems and more particularly to an improved enhancing or decoding system for restoring in a psychoacoustically acceptable manner, audio signals previously processed by any one of a wide variety of non-linear amplifying techniques.

It is generally well known that the dynamic range of audio signals containing program information often exceeds the dynamic range of existing recording and transmission media. Accordingly, various signal conditioning systems and techniques are now known for dynamically compressing the dynamic range of the recorded or transmitted signals so that the signal-to-noise ratio of the transmitted or recorded information of the program signals is improved.

If not properly restored, those music dynamics, which might be "lost" in any nonlinear amplifying process are often psychoacoustically important to recreating the impact and presence of the original sound and, hence, their loss represents a severe limitation to the art of high-fidelity audio reproduction. For this reason, prior to the present invention, it is desirable to restore that part of the dynamic range compressed in recording or transmission by some reciprocal complementary process.

For example, one technique which has proven to be worthwhile, as well as commercially successful, is generally known as the DBX encoding and decoding (companding) process. This process, which is described and claimed in U.S. Pat. No. 3,789,143, issued to David E. Blackmer on Jan. 29, 1974, generally dynamically compresses (encodes) the signal prior to transmission or recording and dynamically expands (decodes) the signal in a complementary manner, after transmission or upon playback.

More specifically, apparatus (called a compander and disclosed in the aforementioned Blackmer patent) for encoding and decoding the signal in accordance with the DBX companding technique includes a signal detector for sensing the input signal amplitude on a low-ripple or ripple-free RMS basis so that the output from the detector is substantially linearly related to the input level in decibels. A control amplifier is provided to set a gain change sense of either compression or expansion and provides a control signal output related to the product of the output of the RMS detector and the gain factor introduced by the amplifier. Lastly, a gain control module is provided for amplifying or controlling the decibel gain of the input signal in proportion to the control signal provided by the control amplifier.

A preferred detector which can be employed in the DBX compander is described and claimed in U.S. Pat. No. 3,681,618 issued to David E. Blackmer, on Aug. 1, 1972. Generally, the preferred detector comprises at least one bilateral converter which provides an output signal related to the logarithm of the RMS value of the input signal, amplification means for doubling the output of the converter and means coupled to the output of the amplification means and including an antilogarithmic device and a charge storage device. The charge storage device is charged responsively to the output of the amplification means in accordance with a square law function.

With the growth and greater acceptance of this and other types of nonlinear amplification techniques in transmission and recording, compander systems are becoming increasingly available to encode and decode the signals. Various compander systems, some in IC form are now commercially available and are used as compressors and/or expanders, but the expanders of one type of system are not necessarily compatible with all companding techniques utilizing other types of compressors. For example, since a DBX encoder utilizes a detector which provides an output signal related to the logarithm of the RMS value of the input signal it is preferable to use a similar type of detector when decoding or tracking the encoded signal. Some available systems, however, do not use such RMS detectors when compressing and subsequently expanding the signals, but instead use, for example, either a peak detector or an averaging detector before entering the logarithm domain. When decoding signals encoded by a compressor having a peak detector, the latter senses signal peaks of the input signal to determine whether the input signal level is above or below a predetermined threshold. The effect of the peak detection is that the expander acts somewhat erratically, and may expand the program when it detects a noise spike or brief signal transient that is not really representative of the program level.

Decoding or expanding signals encoded by a compressor having an averaging detector usually involves sensing the average level of the incoming program to determine whether the signal is above or below a predetermined threshold level. Averaging detectors will not overreact on signal peaks but may respond too slowly to accurately expand a program. The decoder may respond too late to a rapid increase in program level after the actual input signal has begun to decrease again, causing an unnatural or swishing sound.

Since no standard exist for the compression of audio signals prior to recording or transmission, and since many other forms of amplitude nonlinearity may apply in the recording or transmission process, it is not always possible to know, after the fact (After transmission or recording) exactly how the original signal was processed. Thus, is it not always possible to enhance and more specifically expand, in a complementary manner, a signal previously processed by a nonlinear amplifying device.

It is therefore an object of the present invention to provide an improved enhancement system which restores in a psychoacoustically acceptable manner, audio signals, which may ave been previously processed by any one of a variety of nonlinear amplifying techniques.

Another object of the present invention is to provide an improved expander system which minimizes the loss of ambient or reverberant information due to the expanding process.

Another object of the present invention is to provide an improved expander system in which the effect known as "pumping" i.e., the modulation of mid-frequency energy by low frequency energy is minimized.

And another object of the present invention is to provide an improved expander system in which the effect known as "breathing" i.e., the modulation of the high frequency portion of the signal, which contains the majority of unwanted "noise", by the mid or low frequency portions of the signal, is minimized.

Still another object of the present invention is to provide an improved expander system in which the alteration to the timbre of program information by the expansion process is minimized.

And still another object of the present invention is to provide an improved signal conditioning system employing unique band spitting filters with a minimum loss of signal energy.

And yet another object of the present invention is to provide an improved expander system which utilizes the preferred RMS signal detection technique.

And still another object of the present invention is to provide an improved expander system of the type utilizing DBX companding techniques where very long smoothing constants are applied to the control signal for steady state or slowly varying signals, thus adding very little distortion to the audio signal, and at the same time allowing very rapid signal changes to affect similarly rapid changes of the same control signal, thereby allowing for enhancement of transient attack signals.

These and other objects of the present invention are provided by an improved system for enhancing the sound quality and dynamics of transmitted or recorded audio signal previously processed by any one of several nonlinear amplifying techniques wherein the audio signal is divided into substantially discrete and particular frequency bands and each band is separately enhanced independently of the other bands, so as to minimize "breathing" and "pumping". The preferred system also comprises means for minimizing the loss of ambient or reverberant information due to the expansion process. The system also includes means for minimizing the alteration to the timbre of program information, and more particularly employs unique band-splitting filters so as to minimize loss of any signal information. Finally, the preferred system comprises means, coupled to the detector for each frequency band, for allowing very long smoothing constants to be applied to the detector output or control voltage signal for steady state or relatively slowly-varying signals, and allowing very rapid changes to effect a similarly rapid change of the same control voltage signal. For stereophonic systems, a common level sensing path is utilized for the same frequency band of each channel.

Other objects of the invention will in part be obvious and will in part appear hereinafter. The invention accordingly comprises the apparatus possessing the construction, combination of elements, and arrangement of parts which are exemplified in the following detailed disclosure, and the scope of the application of which will be indicated in the claims.

For a fuller understanding of the nature and objects of the present invention, reference should be had to the following detailed description taken in connection with the accompanying drawings wherein:

FIG. 1 is a block diagram of the nonlinear amplifying signal conditioning system of the type described in U.S. Pat. No. 3,789,143;

In the drawings, like numerals refer to similar parts.

Figure 1:
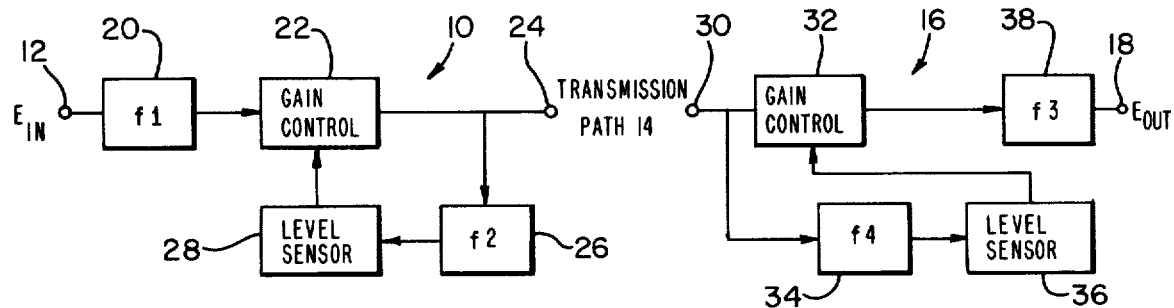

Referring to FIG. 1, the compander of the type described in U.S. Pat. No. 3,789,143 generally includes a compressor 10 for processing, i.e., compressing the input information signal, Ein, applied to the input terminal 12, prior to recording or transmitting the signal on or through the transmission path or channel 14. Subsequent to transmission or recording of the processed signal, the latter is enhanced by the expander 16, whereupon the expanded signal, Eout, is provided at the output terminal 18.

More specifically, the input signal appearing at the input terminal 12 of the compressor 10 is typically applied through high frequency weighting filter 20 to the input of a gain control module 22. The output of module 22 provides the output of the compressor at terminal 24 and is also applied through a negative feedback or level sensing path typically comprising a second high frequency weighting filter 26 connected to the input of a level sensor or detector 28. This level sensing path is designed to apply a control signal to the module 22 in response to the signal level of the output of the module. Level sensor 28 includes detector means, preferably in the form of an RMS detector, such as the one shown and described in the Blackmer patent, U.S. Pat. No. 3,681,618, for sensing the signal level from the output of the module 22 as modified by filter 26, on a low-ripple or ripple-free RMS basis so that the output of the detection means is linearly related to its input in decibels. Level sensor 28 also includes a control amplifier (not shown) for setting the gain change sense, in this case compression, and for providing the control signal output to the module 22. The control signal is related to the product of the output of the detection means and a gain factor introduced by the control amplifier. The module 22 amplifies or controls the gain of the weighted input signal Ein in proportion to the weighted control signal provided by level sensor 28. By way of example, where the gain factor of the control amplifier of the level sensor is set to provide 2:1 compression, theoretically a change in 30 dB of the input signal, Ein, (at all frequencies within the bandwidth of interest) produces a corresponding 15 dB change in the control signal applied by the level sensor 28 to module 22 to produce a 15 dB change in the output signal of the module at terminal 24. Thus, theoretically, a transmission medium having an inherent dynamic range of 46 dB can carry a signal compressed by a 2:1 compressor having a dynamic range of 92 dB.

The encoded information signal, once transmitted through or recorded on the transmission medium 14, is applied to the input terminal 30 of expander 16 so that the signal can be subsequently decoded. The expander is essentially the complement of compressor 10 and thus includes the gain control module 32 and level sensor or detector 36, both of which are identical to the module 20 and level sensor 24, respectively, except they are modified and connected so as to expand the encoded signal back to its original condition. Thus, the input terminal 30 is connected to both the inputs of the gain control module 32 and to a positive feedforward path comprising weighting filter 34 (when necessary) and level sensor 36, with the output of the latter providing the control signal to the gain control module 32. The sensor 36 includes the same detection means (not shown), preferably in the form of an RMS detector, for sensing a signal level of the input of the weighted encoded signal on a low-ripple or ripple-free RMS basis so that the output of the detection means is linearly related to its input in decibels. The control amplifier (not shown) of the level sensor is set for the same gain as provided by its couterpart in the compressor, but in the opposite sense, i.e., for expansion. The output of module 32 is applied through complementary weighting filter 38 (where necessary) to the output terminal 18. The expander 16 therefore restores the encoded signal back to its original level. In the example of 2:1 compander where a 2:1 compressor is used, the gain of the control amplifier of level sensor 36 is set to provide 2:1 expansion. Thus, where an input signal at terminal 30, previously encoded by a 2:1 compressor changes by 15 dB, the control signal output of level sensor 28A will provide a 15 dB change. Since the gain change sense is one of expansion, the change in the output at terminal 18 will provide a 30 dB change.

Various other nonlinear amplifying techniques, such as those using peak detection and averaging detection, are also known for processing an audio signal prior to transmission or recording, and for enhancing, in a complementary manner, the transmitted or recorded signal upon broadcast or playback. Since various nonlinear amplifying techniques are widely used for compressing the programmed information signal previous to transmission or recording it is not always possible to know how the signal has been processed after it has been transmitted or recorded. Accordingly, prior to the present invention, various portions of the signal, particularly those portions of the signal deemphasized during compression, might be lost if not expanded in a complementary manner upon broadcast and playback.

In accordance with the present invention, an improved expander system is provided which can enhance a signal which may have been encoded, substantially independently of the nonlinear amplification technique employed prior to transmission or recording.

Figure 2:
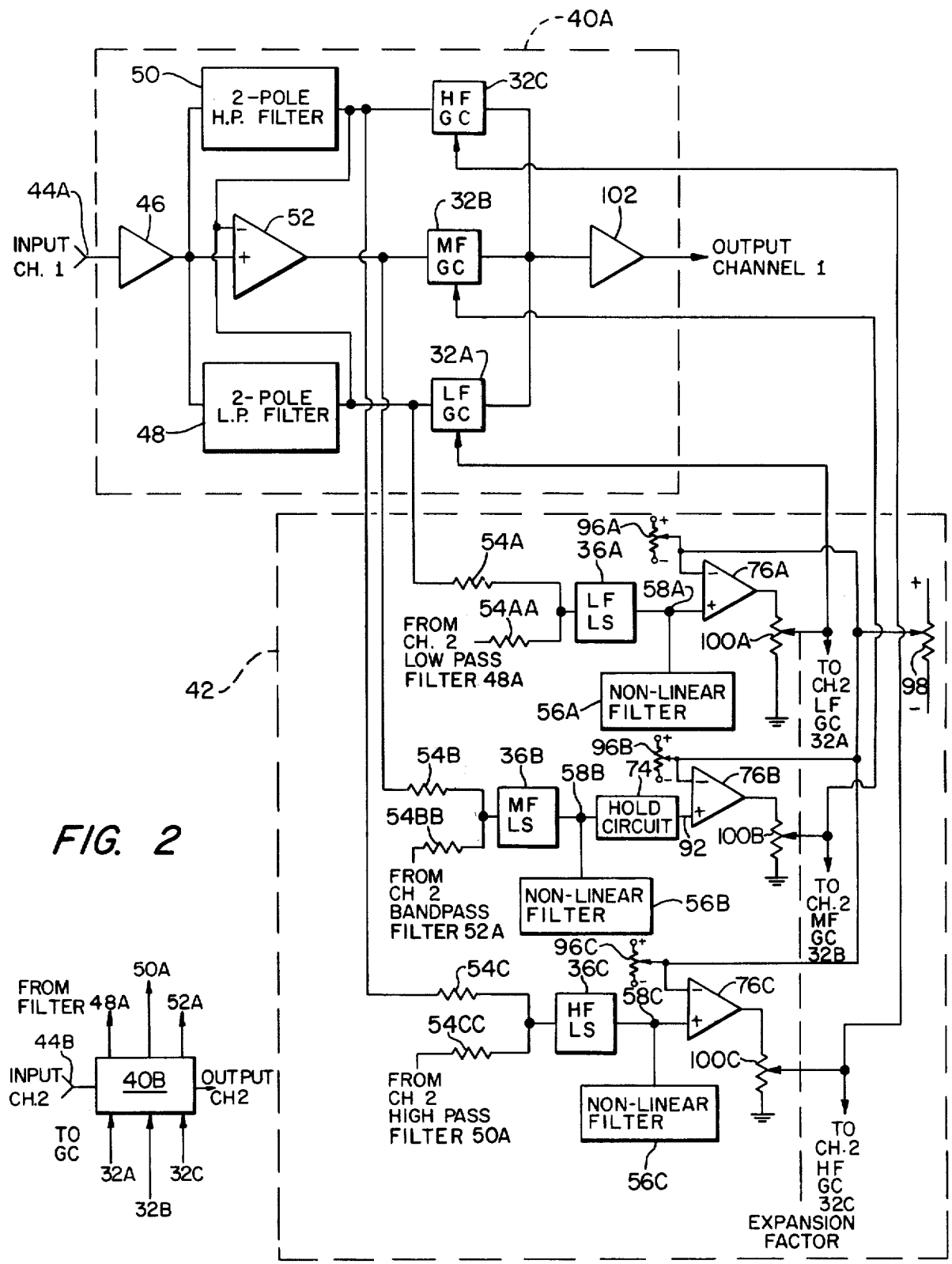
FIG. 2 is a block diagram of the preferred embodiment of the decoding system incorporating the principles of the present invention.

More specifically, referring to FIG. 2, in accordance with the present invention, each signal is restored so that it is psychoacoustically acceptable, regardless of the nonlinear amplification technique used to encode the signal, by providing a differing and independent amount of enhancement or expansion in each of several substantially discrete frequency bands. The preferred expander system for use in stereophonic systems is shown and comprises a separate control unit 40A and 40B having the respective input terminals 44A and 44B for receiving the two stereophonic signals and a common level sensing or detection unit 42. For ease of exposition, it is noted that only the control unit 40A is shown in detail, but it is understood that the control unit 40B is identical to the control unit 40A and is electrically connected to the level sensing unit 42 in an identical manner as control unit 40A, as will be described in greater detail hereinafter. Each input terminal 44 is connected to a buffer or amplifier 46 for amplifying and shaping the audio signal in a manner well known to those skilled in the art. Further, buffer 46 acts as a band pass filter capable of passing the frequency bandwidth of interest. For most audio transmissions and recordings this frequency bandwidth is between about 20 Hz and 20 KHz. The buffer 46, in turn, has its output connected to means for dividing the audio signal output among a plurality of substantially discrete frequency bands. More specifically, the output of buffer 46 is connected to the input of three band-splitting filters 48, 50 and 52. Preferably, the first filter 48 is a two-pole, low pass filter having a three dB cut-off at 200 HZ. The second filter 50 is preferably a two-pole high pass filter having a three dB cut-off at 4 KHz. As shown, the output of the buffer 46 contains signal energy, throughout the entire frequency bandwidth of interest while the output of low pass filter 48 and high pass filter 50 contain respectively substantially only signal energy from the original signal applied t terminal 44 which is below 200 Hz and above 4 KHz, respectively. In order to obtain a signal having signal energy substantially only in the mid frequency range between about 200 Hz and 4 KHz, the output of buffer 46 is also connected to a band pass filter. Preferably, the band pass filter is in the form of a comparative amplifier 52, so that substantially no signal energy is lost. More specifically, the signal energy of the output of filters 48 and 50 are preferably added together and subtracted from the signal output energy of amplifier 46. This is accomplished by connecting the outputs of filters 48 and 50 to the negative input of amplifier 52, while the output of buffer 46 is connected to the positive input of comparative amplifier 52. As well known in the art, comparative amplifiers generally provide an output signal which is substantially the signal energy level at its positive input terminal less the signal energy level at its negative input terminal. Since the positive input receives signal energy from buffer 46 which is over the entire frequency bandwidth of interest, and the negative input essentially includes all the signal energy below 200 Hz and all the signal energy above 4 KHz, the output of comparative amplifier 52 will be substantially that signal energy between about 200 Hz and 4 KHz with substantially no energy loss at the two frequency cut-offs. The output of comparative amplifier 52, therefore, acts as a bandpass filter having a bandpass response of between about 200 Hz and 4 KHz, with single pole slopes, i.e., a 6 dB/octave roll-off at the two frequency cut-offs. This is significant since most of the signal information received at each terminal 44 is typically within this frequency range, while most noise is typically within the lower and higher frequency ranges, (below 200 Hz and above 4 KHz) so that there is a substantial retention of the overtone structure minimizing program information loss.

The output of low pass filter 48 is connected to the input of the control module 32A (the latter hereinafter is referred to as the low frequency gain control module) and to the level sensing unit 42 through summing resistor 54A to the level sensor 36A (the latter hereinafter is referred to as the low frequency level sensor). It is noted that the output of the low frequency filter 48A of control unit 40B is similarly connected to summing resistor 54AA which in turn is also connected to the input of detector 36A. In a similar manner the output of band pass and high frequency filters 52 and 50 are respectively connected to the corresponding inputs of mid frequency and high frequency gain control modules 32B and 32C and through the corresponding summing resistors 54B and 54C to the inputs of midfrequency and high frequency level sensors 36B and 36C. The outputs of the bandpass and high frequency filters 52A and 50A of unit 40B are connected in a like manner through the corresponding summing resistors 54BB and 54CC, which in turn are connected to the mid and high frequency level sensors 36B and 36C. It will be appreciated that each level sensor measures the sum of the signal energy in the two channels of the particular frequency band.

Figure 3:
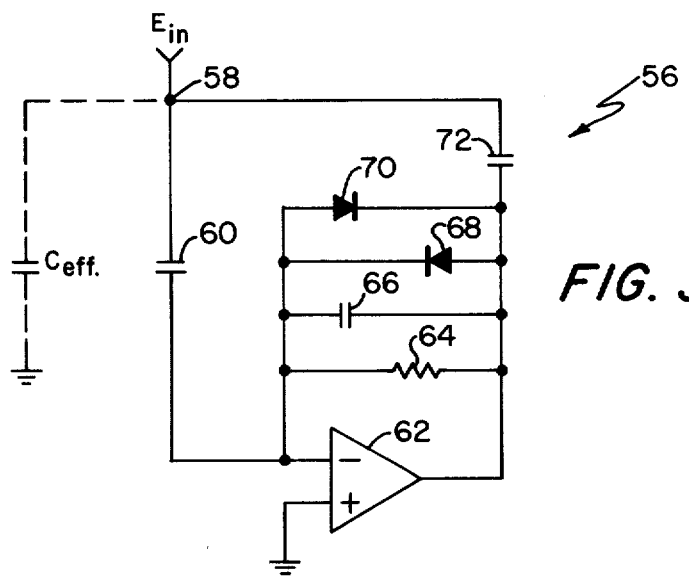
FIG. 3 is a schematic diagram of the nonlinear filter utilized in the embodiment of FIG. 2.

The low, mid and high frequency gain control modules 32A, 32B and 32C are substantially identical to the gain control module 32, shown and described with respect to FIG. 1. The detectors 36A, 36B and 36C are also substantially the same as detector 36 shown and described in FIG. 1, except that the charge storage device (not shown) in FIG. 1, typically provided at the output of the sensor for charging the signal output of the sensor in accordance with a square function, is preferably replaced with means, in the form of the nonlinear filters or charge storage devices 56A, 56B and 56C, respectively, for providing a nonlinear response to changes in the amplitude of the output of the respective detector 36. More specifically, filters 56 allow very long smoothing constants to be applied to the control voltage signal provided at the output of each detector, for steady state or slowly varying signals, so as to substantially reduce the amount of ripple at the output, thus adding very little distortion to the audio signal; and at the same time, allow very rapid signal changes to effect similarly rapid changes of the same control voltage signal at the output of each sensor, thus allowing for the enhancement of transient attach signals. A preferred embodiment of the nonlinear filter is shown in FIG. 3 which essentially functions as a nonlinear capacitor, in which the effective capacitance, Ceff, varies depending on the rate of change of the voltage signal Ein (the desired voltage) appearing at junction 58 at the output of the particular level sensor. More specifically, the junction 58 is connected to a first capacitor 60 to the inverting input of operational amplifier 62, the latter having its positive input connected to the system ground. The output of operational amplifier 62 is connected to its inverting input through the resistor 64, and through capacitor 66. The output of operational amplifier 62 is also connected to the anode of diode 68 and to the cathode of diode 70, both diodes preferably being silicon diodes. The cathode of diode 68 and the anode of diode 70 are, in turn, also connected to the inverting input of operational amplifier 62. The output of operational amplifier 62 is also connected through capacitor 72 to the junction 58. For optimum results, the resistor 64 is preferably of a relatively large value so as to provide a reasonable voltage bias between the inverting input and output of operational amplifier 62. In operation it will be appreciated that the gain of operational amplifier 62, i.e., the ratio of the peak-to-peak voltage at the output of the amplifier 62 over the desired ripple voltage at junction 58, is the ratio of the impedance of the capacitor 60, and the impedance of capacitor 66. These impedances, however, change with frequency. It has been found for optimum performance, the ratio of the capacitances (independent of frequency) i.e., C66/C60, is greater than or equal to about 100. It will be appreciated therefore, that the effective capacitance Ceff is a function of the gain of the operational amplifier 62, which in turn, is a function of how quickly the voltage level is changing at junction 58. For steady state conditions or very slow changing signal levels at junction 58, the diodes 68 and 70 will remain substantially nonconductive, and because of biasing resistor 64, the gain of operational amplifier 62 remains substantially high and thus, Ceff is large. For example, where the gain of the operational amplifier 62 is 100, a 1 dB change at junction 58 (equivalent to about 6 millivolts) provides a 600 millivolt change at the output of operational amplifier 62, a change which is unsufficient to make the diodes 68 and 70 conduct and thus Ceff is rather large. However, as the slew rate at junction 58 increases, the output of the operational amplifier increases 100 fold whereupon the diodes will begin to conduct. As the diodes become more and more conductive, the current through either diode 68 or diode 70 (depending upon whether the voltage change occurs in a positive or a negative sense) increases so that in effect, the gain of the operational amplifier decreases so as to lower the effective capacitance Ceff.

It is noted that the only substantial difference between the nonlinear filters 56A, 56B and 56C are the particular values chosen for the resistor 64 and capacitors 60, 66 and 72, since the attack and release characteristics of the outputs of each of the level sensors differ due to the nature of the particular bandwidth of frequencies being controlled. Generally, the effective capacitance size is larger for the low frequency band sensing path, smaller for the midrange frequency band sensing path and even smaller for the high frequency band sensing path. One particular set of values for the resistors and capacitors which have been proven to provide fairly good results, is shown in Table I below although it will be appreciated that other values may also be used.

TABLE I

| Filter | RES 64 | CAP 60 | CAP 66 | CAP 70 |
|---|---|---|---|---|
| 56A | 1 Mohm | 22 μf | 33 nf | 0.33 μf |
| 56B | 390 Kohm | 3.3 μf | 10 nf | 0.1 μf |
| 56C | 47 Kohm | 1 μf | 3.3 nf | 33 nf |

Referring again to FIG. 2, it is noted that junction 58B at the output of the mid frequency level sensor 36B is also connected to a means, in the form of band-shaping filter 74, for providing a further smoothing of the critical midfrequency band control voltage signal at the output of level sensor 36B and for allowing the programmed material (most of which is present in the mid band frequency range) to control the decay rate of the expander system.

Figure 4:
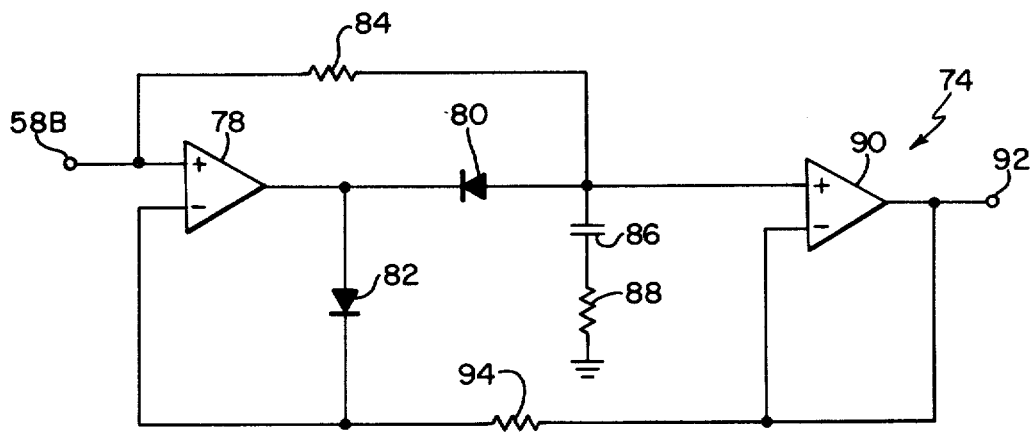
FIG. 4 is a schematic diagram of the holding circuit utilized in the embodiment of FIG. 2.

More specifically, referring to FIG. 4, a preferred embodiment of the band shaping filter is in the form of the peak holding circuit shown. More particularly, the junction 58B is connected to the positive input of operational amplifier 78. The output of operational amplifier 78 is in turn connected to the cathode of diode 80 and anode of diode 82. The anode of diode 80 is connected through discharge resistor 84 to the positive input of amplifier 78; through capacitor 86 to resistor 88, which, in turn, is connected to ground; and to the positive input of operational amplifier 90. The output of amplifier 90 is connected to the output terminal 92; to its negative input, and to resistor 94. The latter, in turn, is connected to the cathode of diode 82 and to the negative input of amplifier 78.

The circuit 74 is essentially a standard peak holding circuit with discharge resistor 84 being added. It is noted that discharge resistor 84, which is preferably of a relatively large value (in the order of 3 megohms) essentially functions as a bleed resistor for a signal held on capacitor 86. In this way, circuit 74 provides some decay when the signal at junction 58B changes abruptly. This is essentially characteristic of reverberant energy, typically present in the mid band range of frequencies which is also slow to decay. Thus, the band-shaping filter helps preserve the tail end (or reverberant) energy of signal information typically in the midrange frequency band.

Referring again to FIG. 2, the junction 58A, the output terminal 92 of holding circuit 74, and the junction 58C are connected, respectively, to the positive inputs of the comparative amplifiers 76A, 76B and 76C. The negative input of amplifiers 76A, 76B and 76C are connected to the respective variable voltage sources 96A, 96B and 96C and to a common variable voltage source 98. Thus, the levels of the outputs of the amplifiers 76 can be independently adjusted by adjusting sources 96 or jointly adjusted by adjusting source 98 so as to set the relative level of the input with respect to the output of each amplifier for providing unity gain. It is noted that this level matching adjustment is preferably optimized between the three bands for the average spectral density for many samples of audio signals.

The outputs of amplifiers 76A, 76B and 76C are connected through corresponding variable resistors 100A, 100B and 100C to the corresponding control terminals of the low frequency, mid frequency and high frequency gain control modules 32A, 32B and 32C of each of the control units 40A and 40B. The contacts of the variable resistors 100A, 100B and 100C of both units are all ganged together, as shown, so that all are adjustable in unison. Thus, the amplitude of the control signals applied to the gain control modules for all the bands of both units can be simultaneously made to adjust the expansion factor of the system as desired. Alternatively, however, these resistors 100A, 100B and 100C may be made independently adjustable so as to optimize the expansion in each band. Further, each resistor 100A, 100B and 100C can be replaced with suitable devices so that nonlinear expansion is provided for each band.

The output of the gain control modules of each control unit are combined by suitable means, such as operational summing amplifier 102, the latter being well known in the art, which in turn drives the output of the channel.

It will be appreciated that the nature of the band splitting and recombining circuit, provided by each control unit 40 and the common level sensing unit 42, is such that when the gain of the three control modules of each unit 40 are the same, the output signal of amplifier 102 of that unit will be an exact replica of the input signal at the corresponding input terminal 44 in both frequency and phase. The system is thus capable of passing a complex wave form without distorting that waveform.

In operation, the encoded stereophonic information signals representative of the two channels are applied to the input terminals 40A and 40B, respectively. The signal is modified by buffer 46 and divided into the three frequency bands by the filters 48, 50 and 52 and separately transmitted over the three signal paths. More particularly, the low, mid and high frequency signal outputs of filters 48, 50 and 52, respectively, are applied to the input terminals of the low, mid and high frequency gain control modules 32A, 32B and 32C. The output of filters 48, 50 and 52 of both control units 40A and 40B are also transmitted over separate level sensing paths by simultaneously applying the outputs of the filters to the respective low, mid and high frequency level sensors 36A, 36B and 36C. In this manner the gain control modules in both the left and right channels for expanding that portion of the information signal in a particular frequency band are controlled together with the same control voltage signal, thus preserving the stereo image or audio perspective. It is further noted that the control signal voltage for each gain control module is derived from its respective level sensor, e.g. the high frequency gain control module is controlled by the level sensor which derives its input from the high pass filter. The voltage control signals applied to each gain control module of each band are preferably derived from the outputs of the respective RMS level detectors 36A, 36B and 36C through the non-linear filters 56A, 56B and 56C, with the latter differing in each band with respect to the time constants of the attack and release characteristics of the detectors. The non-linear filters further allow for a low-ripple signal on the level sensing path for low distortion while retaining fast attack and release characteristics in each frequency band. The output of the level sensor 36B also provides program-dependent exponential decay. The circuit also gives the further smoothing of the critical midband control voltage signal (which is derived from the portion of the original signal containing most of the program information) and thus allows the program material within the mid range of frequencies to control the decay rate of the output of the expander system. The outputs of amplifiers 76A, 76B and 76C thus provide the control signals for the low, mid and high frequency gain control modules 32A, 32B and 32C, respectively, of both control units 40A and 40B. The level matching adjustment provided by the variable voltage sources 96 and 98 allow the relative gain of each band of each control unit in each channel to be set. Further, the expansion factor, i.e., the amount of expansion provided by the system can easily be adjusted by adjusting the resistance of resistors 100A, 100B and 100C by moving the ganged contacts in the embodiment shown. In the alternative, where the resistance values of each resistor 100A, 100B and 100C are independently adjustable, the expansion provided by each band may be optimized or where resistors 100A, 100B and 100C are suitably replaced with non-linear devices, nonlinear expansion can be provided for each band.

Although the present invention has been described in accordance with the preferred embodiment, it will be evident that various modifications can be made without departing from the scope of the invention. For example, the system shown can be used to enhance monophonic signals. In such a situation, only one of the control units is used with the inputs to the level sensors being provided from the particular filters of the control unit and the output from each amplifier 76A, 76B and 76C is applied only to the control inputs of the corresponding low, mid and high frequency gain control modules 32A, 32B and 32C, respectively. Further, although each level sensing path is shown as a feed forward loop, i.e. the information signals are sensed at the output of the corresponding filters, a feedback loop can also be used by deriving the particular control signal for each gain control module from the level output of the particular gain control module. Although the system is shown as comprising three signal paths and a like number of level sensing paths for expanding three frequency bands, the signal can be divided into any number of substantially descrete bands with each being expanded in its own signal path by a control signal derived along a corresponding exclusive level sensing path.

The above described system has several advantages. For one thing, by providing differeing and independent amounts of enhancement or expansion, in each of several bands of frequencies, the system provides a psychoacoustically acceptable restoration of audio signals, previously encoded by any one of a variety of non-linear amplifying techniques. Further, the use of the band shaping filter 74 minimizes the loss of ambient or reverberant information due to the expanding process. By dividing the audio signal into substantially discrete frequency bands and independently expanding each band, the effects known as pumping and breathing are minimized. In addition, the use of bandsplitting filters and in particular the band pass filter 52 having single pole slopes at the two frequency cutoffs so as to include most of the signal information therebetween, prevents an alteration to the timbre of the signal information as a result of completely independent enhancement in each band. The preferred system also uses the more phychoacoustically acceptable technique of RMS signal detection as compared to peak or averaging detection. Finally, the use of the non-linear filters 56 at the output of the detectors allows very long smoothing constants to be applied to the control voltage signals for steady state or slowly varying signals, thus adding very little distortion to the audio signal, but at the same time allowing very rapid signal changes to effect a similarly rapid change of the same control voltage, thus allowing for enhancement of transient (attack) signals.

Since certain changes may be made in the above apparatus without departing from the scope of the invention herein involved, it is intended that all matter contained in the above description and shown in the accompanying drawings shall be interpreted in an illustrative and not in a limiting sense.

What is claimed is:

1. A system for enhancing the sound quality and dynamics of an audio signal having substantially all of its signal energy divided among a plurality of substantially discrete frequency bands, said system comprising;
    an input terminal for receiving said audio signal;
    an output terminal;
    a plurality of separate signal paths between said input and output terminals for respectively and substantially mutually exclusively transmitting an information signal representative of the signal energy of the audio signal in a corresponding one of said frequency bands,
    amplification means disposed in each of said signal paths for amplifying the corresponding information signal by a gain variable responsively to a control signal as to provide a signal output dynamically expanded with respect to said corresponding information signal;
    a like plurality of level sensing means each connected between a corresponding one of said amplification means and a selected point in the respective signal path for sensing at said point the amplitudes of signals transmitted through the respective signal path and for providing responsively thereto said control signal as a logarithmic function of the amplitude of the sensed signals;
    means for providing a signal to said output terminal as a function of the sum of said signal outputs of all of said amplification means; and
    filtering means, coupled to the output of each of said level sensing means, for modifying said control signal nonlinearly with respect to the rate of change of the output of said level sensing means so as to allow relatively long smoothing constants to be applied to said control signal when the output of said level sensing means is a steady state or relatively slowly-varying signal, and so as to allow a relatively rapidly-varying signal at the output of said level sensing means to effect a relatively rapid change in said control signal.

2. A system in accordance with claim 1 further including means coupled to said input terminal for receiving said audio signal and for dividing said audio signal among said plurality of discrete frequency bands.

3. A system in accordance with claim 2, wherein said means for dividing said audio signal comprises at least a low pass filter having a 3 dB cut-off at a first predetermined frequency a high pass filter having a 3 dB cut-off at a second predetermined frequency greater than said first predetermined frequency and a band pass filter for passing mid frequency signal energy between said first and second predetermined frequencies.

4. A system in accordance with claim 3, wherein said first predetermined frequency is approximately 200 Hz and said second predetermined frequency is approximately 4 KHz.

5. A system in accordance with claim 3, wherein said band pass filter comprises a comparative amplifier having its inputs connected to subtract the signal energy of the output signals of said low and high pass filters from said audio signal so that substantially no signal energy is lost by said filters.

6. A system in accordance with claim 3 wherein the dominant signal energy portion of said audio signal is between said first and second predetermined frequencies and said bandpass filter has a frequency response with single pole slopes at said first and second predetermined frequencies.

7. A system in accordance with claim 1, wherein one of said frequency bands includes substantially most of the program information including ambient and reverberant information contained in said audio signal, said system further comprising means coupled to the output of the level sensing means connected to the signal path of said one band, for substantially preserving said ambient and reverberant information and for minimizing the alteration to the timbre of said program information.

8. A system in accordance with claim 7, wherein said means for preserving said ambient and reverberant information include a non-linear charge storage device.

9. A system in accordance with claim 1, further including means for varying the expansion factor provided by said system.

10. A system in accordance with claim 9, further including means for independently adjusting said expansion factor for each of said signal paths.

11. A system in accordance with claim 9, wherein said expansion factor is a substantially linear function through said frequency bands.

12. A system in accordance with claim 1, wherein each of said level sensing means senses said amplitudes of said signals at said point of said signal path on an RMS basis.

* * * * *